US006795321B2

(12) United States Patent
Balakrishnan et al.

(10) Patent No.: US 6,795,321 B2
(45) Date of Patent: Sep. 21, 2004

(54) METHOD AND APPARATUS FOR SENSING CURRENT AND VOLTAGE IN CIRCUITS WITH VOLTAGE ACROSS AN LED

(75) Inventors: Balu Balakrishnan, Saratoga, CA (US); Arthur B. Odell, Cupertino, CA (US)

(73) Assignee: Power Integrations, Inc., San Jose, CA (US)

( * ) Notice: Subject to any disclaimer, the term of this patent is extended or adjusted under 35 U.S.C. 154(b) by 151 days.

(21) Appl. No.: 10/188,583

(22) Filed: Jul. 3, 2002

(65) Prior Publication Data

US 2003/0021129 A1 Jan. 30, 2003

Related U.S. Application Data

(60) Provisional application No. 60/306,719, filed on Jul. 20, 2001.

(51) Int. Cl.[7] .............................................. H02M 3/335
(52) U.S. Cl. .................................................. 363/21.15
(58) Field of Search ......................... 363/21.07, 21.15; 327/589, 77, 81

(56) References Cited

U.S. PATENT DOCUMENTS

| 4,250,501 | A | | 2/1981 | Pokrandt | |
|---|---|---|---|---|---|
| 4,389,640 | A | | 6/1983 | Dawdy | |
| 4,649,464 | A | * | 3/1987 | Shono | 363/21.15 |
| 4,829,290 | A | | 5/1989 | Ford | |
| 5,235,505 | A | | 8/1993 | Hiruma | |
| 5,949,661 | A | * | 9/1999 | Minkkinen | 363/21.07 |
| 5,982,639 | A | * | 11/1999 | Balakirshnan | 363/21.18 |
| 6,208,533 | B1 | * | 3/2001 | Ogawa | 363/21.08 |

* cited by examiner

Primary Examiner—Shawn Riley
(74) Attorney, Agent, or Firm—Blakely Sokoloff Taylor & Zafman LLP

(57) ABSTRACT

Methods and apparatuses to sense current and voltage in circuits with voltage drop. A sense circuit includes a series combination of a diode and a resistor in the path of the current to be sensed, the voltage across this series combination coupled to drive a light emitting diode (LED).

30 Claims, 5 Drawing Sheets

US 6,795,321 B2

METHOD AND APPARATUS FOR SENSING CURRENT AND VOLTAGE IN CIRCUITS WITH VOLTAGE ACROSS AN LED

RELATED APPLICATION

This application claims priority to U.S. provisional application Ser. No. 60/306,719, filed Jul. 20, 2001, entitled "Method And Apparatus For Low Cost Current And Voltage Sense Circuits With Voltage Drop."

BACKGROUND OF THE INVENTION

1. Field of the Invention

The present invention relates generally to circuits with voltage and current sensing and, more specifically, the present invention relates to current and voltage sensing in circuits with voltage drop.

2. Background Information

Most battery operated portable electronic products such as cell phones, personal digital assistants (PDAs), etc. require a low power alternating current (AC) to direct current (DC) charger power supply with a constant voltage and constant current (CC/CV) characteristics for charging batteries. Most of these chargers require relatively accurate and expensive circuitry to meet the specified current and voltage tolerances over temperature.

In a known circuit, voltage is sensed by using an accurate programmable reference IC such as a TL431, which drives an opto-coupler feedback circuit to control the output voltage at a programmed value set by external resistors. A relatively high level of accuracy is needed at the output of the charger circuit in order to meet a lower accuracy at the load due to voltage drop in the output cable that connects the charger to the load (the electronic product). The voltage drop in the output cable reduces the output voltage as load increases degrading the overall voltage tolerance at the load. A required level of voltage accuracy at the charger output can be achieved by choosing a TL431 IC that has been trimmed to the appropriate accuracy level. TL431s with 3%, 2% and 1% accuracy are widely available. TL431 voltage reference is generally more expensive than a simple zener reference. However, zeners are generally difficult to get at tolerance below 2% and the zener voltage varies with the current through it, resulting in a poorer load regulation in circuits that have zener currents that vary with output load due to low gain of the feedback loop. In addition, they are only available in certain standard voltage values, which makes it difficult to center the output voltage at the optimum point for the best tolerance.

For low cost, the current sensing in low power applications (e.g. <5W) is usually done by using a voltage drop across a current sense resistor to turn on a bipolar a transistor. This circuit uses the base emitter voltage, $V_{BE}$ of the transistor as a reference. The transistor in turn drives an optocoupler feedback circuit to control the output current at a constant value. The constant current limit set by such a circuit, however, has a large temperature variation due to the high temperature coefficient of $V_{BE}$ (−2 mV/° C.). This can be compensated to the first order by using a thermister based resistor network which add to the component count and cost.

SUMMARY OF THE INVENTION

Methods and apparatuses for sensing current and voltage in circuits with voltage drop are disclosed. In one aspect of the invention, a current sense circuit is described including a series combination of a diode and a resistor in the path of the current to be sensed, the voltage across this series combination coupled to drive an light emitting diode (LED). In one embodiment, the LED is part of an optocoupler and the optocoupler is part of a feedback circuit of a switched mode power supply. In one embodiment, the diode is a PN junction diode.

In another aspect of the invention, a current and voltage sense circuit is described including a current sense circuit having a series combination of a diode and a resistor in the path of a load current supplied from an output and the voltage across this series combination is coupled to drive an LED. The current and voltage sense circuit also includes a voltage sense circuit coupled to the output. The voltage sense circuit includes a voltage reference coupled to the base of a bipolar transistor. The bipolar transistor drives the LED when the voltage at the output exceeds a sense voltage of the voltage sense circuit. The voltage reference is a zener and the sense voltage of the voltage sense circuit is the sum of the voltage across the zener and the forward base emitter voltage ($V_{BE}$) of the bipolar transistor. In one embodiment, the LED is part of an optocoupler and the optocoupler is part of a feedback circuit of switched mode power supply. In one embodiment, the diode is a PN junction diode.

In yet another aspect of the invention, a voltage drop compensation circuit is described including a voltage sense circuit coupled across a voltage output. The voltage sense circuit includes a voltage reference coupled to drive the base of the bipolar transistor when the voltage at the voltage output exceeds a sense voltage of the voltage sense circuit. A compensation resistor is coupled to the voltage output to carry a current that substantially represents the current that flows from the voltage output to a load that is coupled to the output. The sum of the voltage across the compensation resistor and the forward base emitter voltage of the bipolar transistor is applied across a series combination of a second resistor and a diode. The current through the second resistor is used to alter the sense voltage of the voltage sense circuit. In one embodiment, the sense voltage is increased as the current to the load increases. In one embodiment, the diode is replaced by a short circuit. In one embodiment, the voltage reference is a zener and the sense voltage of the voltage sense circuit is the sum of the voltage across the zener and the forward base emitter voltage ($V_{BE}$) of the bipolar transistor and, the current through the second resistor is passed through the zener. In one embodiment, the voltage sense circuit further includes a third resistor and the sense voltage is the sum of the voltage across the voltage reference, the voltage across the third resistor and the forward emitter bias voltage of the bipolar transistor and, the current through the second resistor is passed through the third resistor. In one embodiment, the diode is a PN junction diode. In one embodiment, the bipolar transistor drives an LED of an optocoupler and the optocoupler is part of a feedback circuit of switched mode power supply.

In still another aspect of the present invention, a voltage drop compensation circuit is described, which includes a voltage sense circuit coupled across a voltage output. The voltage sense circuit includes a first resistor coupled to a zener, which is coupled to drive an LED of an optocoupler when the voltage at the voltage output exceeds a sense voltage of the voltage sense circuit. The sense voltage of the voltage sense circuit is the sum of the voltage across the zener and the forward voltage of the optocoupler LED and the voltage across the first resistor. The voltage sense circuit also includes a current sense circuit, which provides a voltage representative of current delivered to a load coupled to the voltage output. The voltage sense circuit also includes a voltage compensation circuit coupled to change the voltage across the first resistor of the voltage sense circuit responsive to the voltage provided by the current sense circuit. In one embodiment, the voltage across the first resistor is increased as the current supplied to the load increases. In one embodiment, the current sense circuit includes a series combination of a second resistor and a diode. In one embodiment, the voltage compensation circuit includes a third resistor coupled to the emitter of a bipolar transistor and a series combination of the third resistor and a base emitter junction of the bipolar transistor is coupled across the current sense circuit, such that the collector current of the transistor is proportional to the voltage across the second resistor. In one embodiment, the bipolar transistor collector is coupled to the first resistor such that the voltage drop across the first resistor is responsive to the voltage across the second resistor. In one embodiment, the optocoupler is part of a feedback circuit of switched mode power supply. Additional features and benefits of the present invention will become apparent from the detailed description and figures set forth below.

BRIEF DESCRIPTION OF THE DRAWINGS

The present invention detailed is illustrated by way of example and not limitation in the accompanying figures.

DETAILED DESCRIPTION

Figure 1:
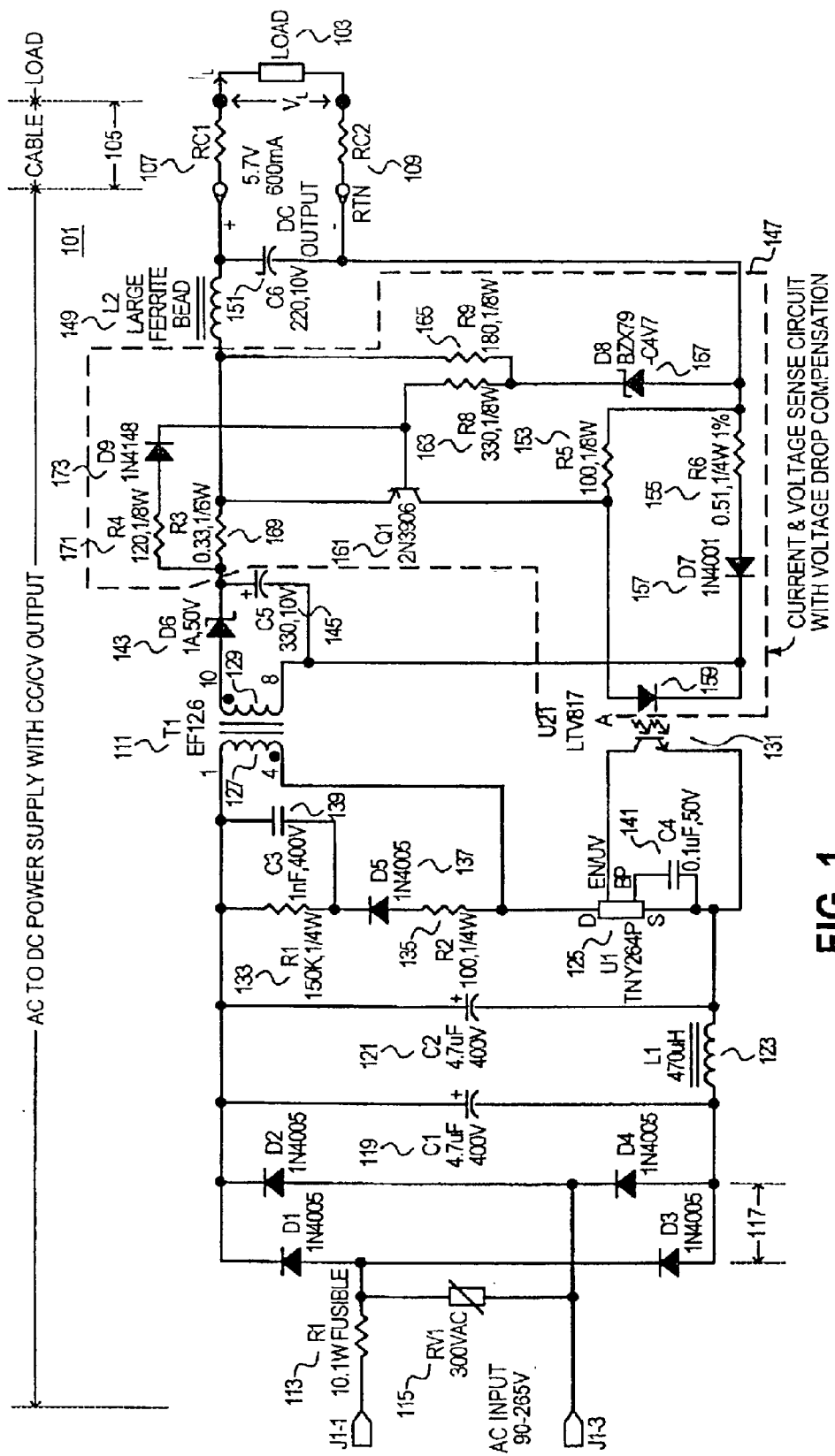
FIG. 1 shows one embodiment of a switched mode AC to DC power supply with CC/CV output coupled to a load through a cable in accordance with the teachings of the present invention.

Embodiments of methods and apparatuses for providing current sensing, voltage sensing and voltage drop compensation in circuits, such as for example but not limited to power supply circuits, are disclosed. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

As an overview, embodiments of the present invention provide a very low cost, constant voltage, constant current sensing circuit that is relatively temperature independent. A cable resistance compensation circuit in accordance with one embodiment increases accuracy of the voltage at the load by compensating for the cable voltage drop. This also allows a lower cost voltage sense circuit to be used. A current sense circuit according to one embodiment can also be used for detecting the sensed current crossing a threshold for monitoring and protection purposes. One embodiment the present invention can be used to provide a relatively accurate, temperature compensated constant voltage and current characteristic for battery chargers.

One of the described embodiments of the present invention uses zener based voltage sense for low cost. The reduced accuracy of the zener sensing is compensated for by a novel voltage drop compensation technique. This technique increases the sense voltage as a function of load to compensate for cable voltage drop and any change in zener voltage due to load related change in zener current. The net effective voltage accuracy measured at the load with this circuit is comparable to more expensive TL431 based circuits. Alternatively, the voltage drop compensation circuit could also be used in combination with more accurate voltage sense circuits such as the ones based on TL431 IC, to compensate for resistive drops in the conductors (wires, cables, printed circuit board traces, etc.) that connect the load to the voltage sense point, to further improve regulation accuracy at the load.

In one embodiment, the current sensing is done by using the forward voltage of the Light Emitting Diode (LED) as a voltage reference. The current is sensed by a series combination of a PN junction diode and a resistor and the voltage developed by this series combination is applied across the LED. This circuit takes advantage of the fact that the LED forward voltage has a temperature coefficient that is similar to that of the PN junction diode, but its absolute value is approximately 300 mV higher than that of the PN junction diode; i.e. a forward voltage of approximately 1V for LED vs. 0.7V for the PN junction diode. Thus, the voltage across the sense resistor in one embodiment is 300 mV and is relatively independent of temperature. In this embodiment, this current sense circuit provides a relatively temperature independent constant current output using LED of an optocoupler in a closed loop feedback circuit. An added advantage of this circuit is that it provides constant current all the way down to a short circuit at the output. This is because the optocoupler LED is always driven in the constant current mode, independent of the output voltage.

In other embodiments, the simple low cost current sense circuit disclosed can also be used in an open loop fashion to detect a current crossing a threshold for monitoring and protection purposes, such as, over-current or overload detection, under-current or light load detection, over current shutdown, etc. In these applications, the crossing of current threshold can be detected by the turn on (when current cross above the threshold) and turn off (when current crosses below the threshold) of the output transistor of the optocoupler. Alternatively, a stand alone LED can be used to visually indicate a current crossing a threshold. For example, the LED on a power supply could light up to indicate that a power supply is loaded or over loaded.

Thus, embodiments of the presently described current sense circuit, a relatively temperature independent current threshold is obtained with a circuit that is very simple and low cost. It is appreciated that although embodiments of the present invention are described herein with a switched mode power supply, it is noted that other embodiments of the present invention are not limited in use to switched mode power supplies or even to power supplies in general. For example, the embodiments of the present invention can be used for sensing voltage and current in linear power supplies, instrumentation systems that have remote sensors, monitoring of current or voltage crossing a set threshold, etc. Embodiments of the present invention can be used in a open loop system for monitoring voltage or current or in a closed loop system for regulation of voltage or current.

FIG. 1 shows a switched mode AC to DC power supply 101 with CC/CV output coupled to a load 103 through a cable 105 having resistances of RC1 107 and RC2 109 in the positive and negative conductors respectively. This circuit uses one embodiment of the novel current sense, voltage sense and voltage drop compensation circuit according to the teachings of the present invention (shown within dotted lines) on the secondary side 129 of the transformer T1 111. The circuit operates in closed loop, to provide a relatively accurate constant current, constant voltage output.

In one embodiment, R1 113 is a fusible resistor that acts like a fuse for protecting the power supply 101 from component shorts and overloads. RV1 115 is a metal oxide varistor (MOV) used to clamp AC line transient from damaging the power supply. Diodes D1–D4 form a rectifier bridge 117 to convert AC to DC and the capacitors C1 119 and C2 121 smooth the DC voltage. C1 119 and C2 121 in combination with inductor L1 123 also provide electromagnetic interference (EMI) filtering for high frequency noise that is generated by the switching power supply 101 to limit conducted emission transmitted on to the AC line. U1 125 is a switched mode power supply controller with an integrated high voltage switch. In one embodiment, U1 125 is a TNY264 device, which is a member of TINYSwitch II family of switched mode power supply ICs manufactured by Power Integrations of San Jose, Calif. Power supply controller 125 converts the high voltage DC across C2 121 into high frequency AC across the primary winding 127 (terminals 1 and 4) of the transformer T1 111. The amount of power delivered to the secondary terminals 129 (8 & 10) of T1 111 is controlled in closed loop through the EN/UV pin of the power supply controller 125. An optocoupler U2 131 is used to provide the feedback with isolation from the secondary side 129 of transformer 111 for closed loop control. In one embodiment, elements R1 133, R2 135, D5 137 and C3 139 clamp leakage inductance spikes across the primary winding 127 of transformer T1 111. C4 141 is a bypass capacitor for the power supply controller 125 internal supply pin. D6 143 provides rectification and C5 145 provide filtering on the secondary 129 to deliver a DC voltage across C5 145. The circuit enclosed by the dotted line box in FIG. 1 on the secondary side 129 of transformer T1 111 is one embodiment of a current sense, voltage sense and voltage drop compensation circuit 147 in accordance with the teachings of the present invention that is shown separately in FIG. 2 for clarity. L2 149 and C6 151 is a high frequency post filter for reducing switching frequency ripple at the DC output terminals.

Figure 2:
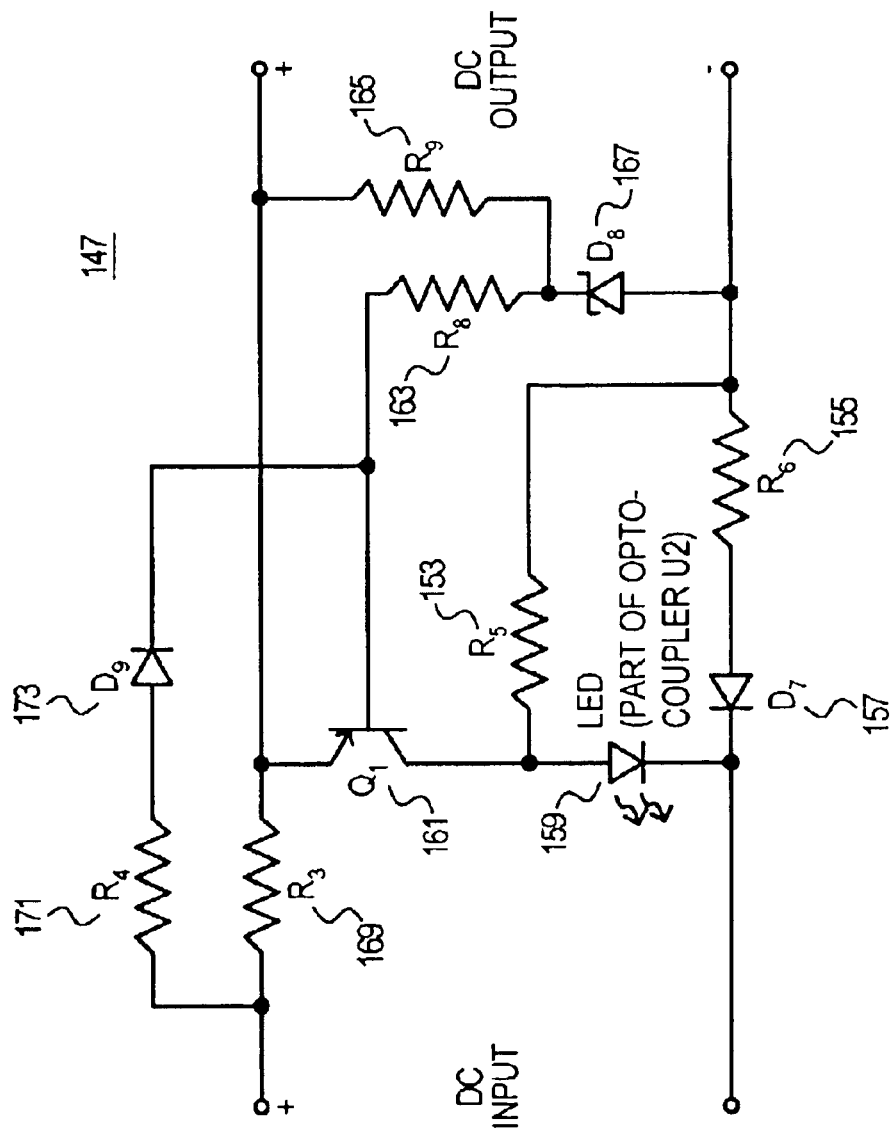
FIG. 2 shows one embodiment of a current and voltage sense circuit with voltage drop compensation in accordance with the teachings of the present invention used in the power supply of FIG. 1. in accordance with the teachings of the present invention.

FIG. 2 shows one embodiment of a current and voltage sense circuit 147 with voltage drop compensation in accordance with the teachings of the present invention used in the power supply of FIG. 1. The DC input terminals are coupled across C5 145 on the secondary winding 129 side of transformer T1 111 of FIG. 1. The DC output terminals are coupled through the high frequency post filter (L2 149 and C6 151 ) and a cable 105 having a resistance RC1 107 and RC2 109, on positive and negative rails respectively, to the load 103. A high frequency post filter (L2 149, C6 151) that is shown in FIG. 1 has very little effect, if any, on the DC voltages and currents that are passed though directly to the cable 105. If L2 149 in FIG. 1 introduces any significant series resistance, this could be lumped with the cable resistances RC1 107 for voltage drop compensation purposes. So, for the discussion that follows, the post filter is assumed to be transparent to DC voltages and currents.

In one embodiment, R5 153, R6 155, D7 157 and optocoupler LED 159 constitute the current sense circuit. The voltage sense circuit includes PNP transistor Q1 161, R8 163, R9 165 and zener D8 167. In one embodiment, zener D8 167 provides a voltage reference for the voltage sense circuit. The voltage drop compensation for the voltage sense circuit is performed by R3 169, R4 171, D9 173 in conjunction with R8 163.

In the embodiment shown, R6 155 and D7 157 are the current sensing components in return path of the current on the negative rail coupled to the DC output. The current through R6 155 and D7 157 is substantially equal to the load 103 current $I_L$, which is supplied from the DC output and flows through the load 103 coupled to the DC output. The voltage dropped across R6 155 and D7 157 is applied across the LED 159 of the optocoupler 131 through the resistor R5 153, which limits the LED 159 current during the constant current mode of operation. R5 also limits the current that would flow through R6 155 and D7 157 when in the constant voltage mode of operation. When the output current exceeds the current sense threshold that is set by the difference between the forward voltages of the LED 159 and the PN junction diode D7 157, which in one embodiment is approximately 300 mV, divided by the value of the resistance R6 155, the LED 159 of the optocoupler 131 conducts. This in turn reduces the power delivered by the power supply controller 125 to the transformer 111 to maintain the output current in regulation at the current sense threshold. In the example shown in FIG. 1, the estimated value of R6 155 required for the constant current output of 600 mA is 300 mV/600 mA, which equals 0.5 ohms. It is noted that the value of 0.51 ohms for R6 155 shown in FIG. 1 was determined empirically for optimum positioning for one embodiment for the constant current value within the specification limits.

In the constant voltage mode of operation of one embodiment, the output voltage is regulated at a sense voltage that is the sum of the zener D8 167 voltage, base emitter voltage $V_{BE}$ of Q1 161, which is approximately 0.7V, and any voltage drop across resistor R8 163 that is generated by the voltage drop compensation circuit. R9 165 provides constant bias current through the zener D8 167 to reduce its dynamic impedance. When the output exceeds the sense voltage, the transistor Q1 161 conducts and drives the LED 159 of the optocoupler 131 to reduce the power delivered by the power supply controller 125 to the transformer 111 to maintain the output voltage in regulation at the sense voltage.

In one embodiment, R3 169 is the compensation resistor that is on the positive rail coupled to the DC output and has a current that is substantially equal to load 103 current $I_L$. The voltage developed across R3 169 is substantially equal to the voltage across the resistor R4 171 independent of temperature because the forward voltage drop of diode D9 173 and the $V_{BE}$ of the transistor Q1 161 and their temperature coefficients are substantially the same in one embodiment. This is because both are PN junctions. Therefore, the current generated by R4 171 is proportional to the load current $I_L$ and flows through R8 163. The base current of Q1

161 by design is negligible compared to the current through R4 171. Therefore, the voltage drop across R8 163 is proportional to the load 103 current $I_L$. As load 103 current $I_L$ increases, the voltage drop across R8 163 increases, increasing the reference voltage and therefore the output voltage of the power supply 101 to compensate for the cable 105 resistance drop to maintain a substantially constant voltage $V_L$ at the load 103 that is independent of the load 103 current $I_L$.

In the example shown in FIG. 1, the R3 169 value was chosen to drop a voltage at full load of 600 mA that is substantially larger than any component to component variation of differences in the diode D9 173 forward voltage and the $V_{BE}$ of Q1 161. In one embodiment, the component voltage drop variations for PN junction diodes is in the order of 20 mV. Accordingly, assuming that a voltage drop 10 times larger is chosen (e.g. 200 mV), the value of R3 169 is 200 mV/600 mA, which equals 0.33 ohms. This value also has to be sufficient to provide the required voltage drop compensation at full load. An R4 171 value of 120 ohms is chosen to provide a current as a function of load 103 that is much larger than the base current of Q1 161. At full load the current through R4 171 is 200 mV/120 ohms, which is equal to 1.67 mA. This means the R4 171 current will range from close to 0 mA at no load to 1.67 mA at full load. The value of R8 163 is then chosen to provide sufficient drop at full load to increase in sense voltage by an amount that is sufficient to compensate for the resistive voltage drops in the cable 105 coupled to the DC output. In the example of FIG. 1, the R8 163 value chosen is 330 ohms, which changes the sense voltage by 1.67 mA×330 ohms, which equals 0.55 V. This will provide compensation for a cable 105 resistance of approximately 0.55V/600 mA, which equals 0.9 ohms. The calculations above neglect the change in zener D8 167 voltage with current due to its internal impedance, which is usually small compared to 330 ohms. In any case, the actual value of R8 163 can be fine tuned empirically accounting for second order effects of the circuit to provide a substantially constant voltage output from no load to full load as measured at the load.

In the example shown, the collector current of Q1 161 is the sum of LED 159 current, which in one embodiment is approximately 250 uA for driving power supply controller 125 devices independent of loading, and the current through R5 153. The current though R5 153 is maximum at no load and it can be estimated by dividing the voltage difference between the forward drop of the LED159 of the optocoupler 131 and the PN junction diode D7 157 by the resistor value of R5 153, which is: 300 mV/100 ohms, which equals 3 mA. This is because the drop across the resistor R6 155 is negligible at no load. The total maximum Q1 161 current in one embodiment is 3.25 mA. Assuming a beta for Q1 161 of 100, the base current of Q1 161 is approximately 33 uA which translates to 33 uA×330 ohms, which equals 10 mV across R8 163 at no load. This is negligible compared to the output voltage of 5.7V. A standard 4.7V zener diode D8 167 is biased close to 5V by the current through R9 165 of 0.7V/180 ohms, which equals 3.9 mA to center the output voltage at 5V+$V_{R8}$(0V)+$V_{BE}$ (0.7V), which equals 5.7V at no load.

In another embodiment, it is possible to eliminate the resistor R8 163 by using zener diode D8 167 internal impedance to perform the function of R8 163. In this embodiment, the value of R4 171 can be adjusted to provide the required change in zener D8 167 current to provide the change in sense voltage at full load.

In another embodiment, it is also possible to eliminate D9 173 and use a correspondingly larger value of R4 171 to save cost. The voltage across R4 171 will then be equal to the drop across R3 169 plus a $V_{BE}$ (approximately 0.7V at room temperature) and the value of R4 171 can be chosen to provide the desired amount of voltage compensation at room temperature. The voltage across R4 171 will vary with temperature due to the $V_{BE}$ temperature coefficient of approximately −2 mV/° C. This will change the voltage compensation as a function of temperature that may be acceptable in some cases and desirable in some others.

Figure 3:
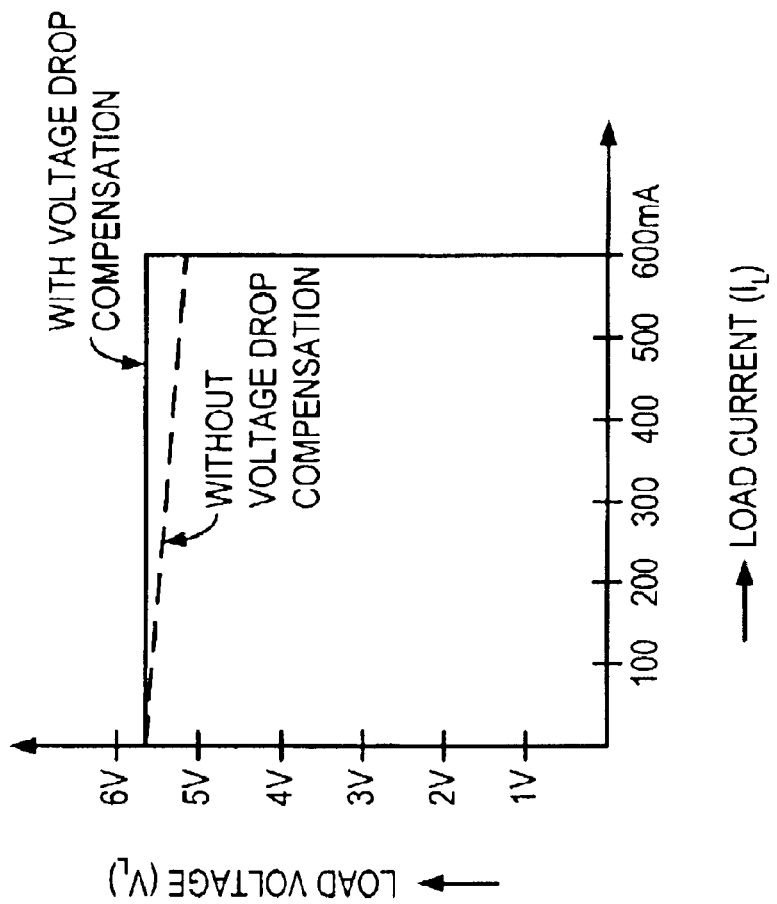
FIG. 3 shows one embodiment of the current vs. voltage characteristics at the load in accordance with the teachings of the present invention.

FIG. 3 shows one embodiment of the IV (current vs. voltage) characteristics 301 at the load for the circuit in FIG. 1. The dotted line shows how the load voltage $V_L$ would drop with increasing load current, due to the cable resistance, if there were no voltage drop compensation.

Figure 4:
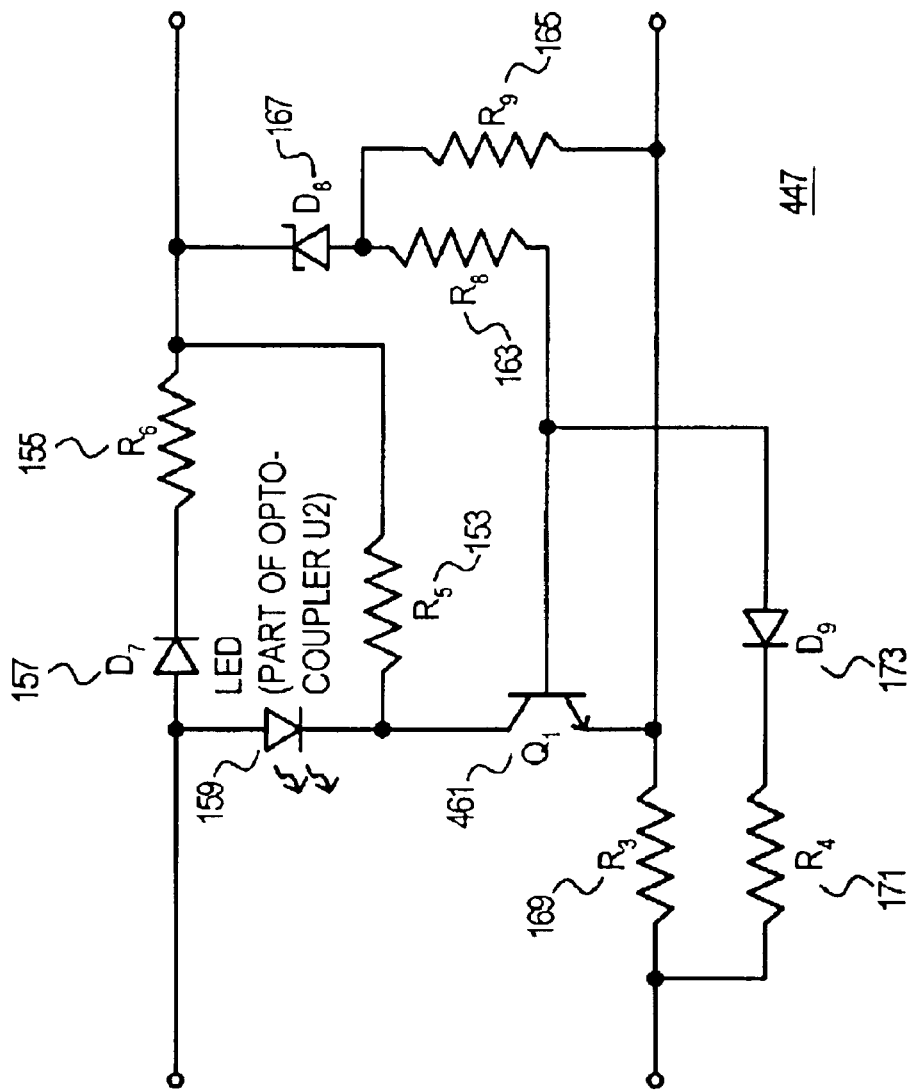
FIG. 4 shows another embodiment of a current and voltage sense circuit with voltage drop compensation in accordance with teachings of the present invention.

FIG. 4 shows another embodiment of a circuit 447 in accordance with the teachings of the present invention that is a complementary version of the circuit 147 in FIG. 2. This circuit uses a NPN transistor Q1 461 instead of a PNP transistor Q1 161 used in FIGS. 1 and 2. This requires that the current sensing is done on the positive rail coupled to the DC output and the voltage drop compensation is done on the negative rail. The component numbers shown in FIG. 4 match with the equivalent components shown in FIG. 2. The operation and performance of the circuits are otherwise identical to the circuit in FIG. 2.

Figure 5:
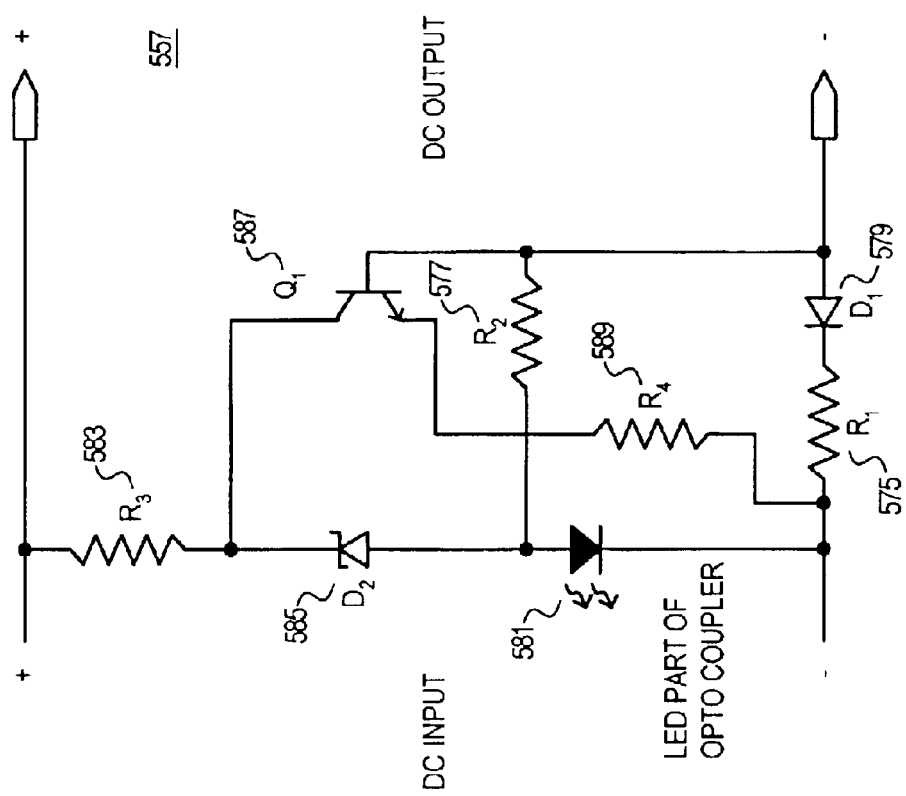
FIG. 5 shows another embodiment of a current and voltage sense circuit with voltage drop compensation in accordance with teachings of the present invention.

FIG. 5 shows another embodiment of a novel current sense, voltage sense and voltage drop compensation circuit 557 according to the teachings of the present invention. In the embodiment in FIG. 5, the DC input terminals are coupled across capacitor C5 145 on the secondary winding 129 side of transformer T1 111 of FIG. 1. The DC output terminals are coupled through a high frequency post filter (L2 149 and C6 151) and a cable 105 having a resistance RC1 107 and RC2 109 as shown in FIG. 1, on positive and negative rails respectively, to the load 103. In one embodiment, R1 575, R2 577, D1 579 and the optocoupler LED 581 constitute the current sense circuit. The voltage sense circuit includes R3 583, D2 585 and the optocoupler LED 581. The voltage compensation circuit includes Q1 587 and R4 589. The operation of the current sense circuit is identical to that described in FIG. 1.

In the constant voltage mode of operation of one embodiment, the output voltage is regulated at a sense voltage that is the sum of the voltage across zener D2 585, the optocoupler LED 581 forward voltage drop and the voltage across R3 583 minus the voltage across R1 575 and D1 579 forward voltage drop. R2 577 limits the current through the optocoupler LED 581 when it is being driven by the current sense circuit (constant current mode). R2 577 also provides bias current for zener D2 585 when the circuit is in a voltage sensing mode or constant voltage mode.

The voltage drop compensation is achieved by increasing the current through R3 583 in response to increased output load 103 current $I_L$. This function is achieved through the coupling of the base emitter junction of Q1 587 in series with R4 589, in parallel to R1 575 and D1 579. The voltage drop across R1 575 is representative of the output load 103 current $I_L$. The voltage drop across D1 579 is substantially equal to the base emitter drop of Q1 587 and has the same temperature coefficient providing temperature compensation. The voltage across R1 575 is therefore substantially equal to the voltage across R4 589 independent of temperature. The value of R4 589 therefore determines the Q 587 collector current for a given output load 103 current $I_L$ and hence the relationship between the voltage drop across R3 583 and the output load 103 current $I_L$. R4 589 is chosen to compensate for both the voltage drop across R1 575 and the voltage drop due to cable 105 resistance, RC1 107 and RC2 109, of FIG. 1.

In another embodiment, a complimentary version of the circuit shown in FIG. 5 is constructed. This is similar to the complimentary versions of the same circuit shown in FIGS. 2 and 4. In particular, the complementary circuit embodiment uses a PNP transistor instead of an NPN transistor Q1 587 and the current sensing done on the positive rail coupled to the DC output. The voltage sense circuit would couple the optocoupler LED to the positive output rail in series with D2 585 and R3 583 coupled to the negative output rail with R4 589 coupled between the positive rail and the PNP transistor emitter. The operation and component choice is identical to the circuit of FIG. 5 described above.

In the foregoing detailed description, the method and apparatus of the present invention has been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A circuit, comprising:
   a current sense circuit including a first diode, a first resistor coupled to the first diode and a light emitting diode (LED) coupled to the first diode and the first resistor, the LED is driven in response to a voltage drop across the first diode and the first resistor to sense a first current directed through the first diode and the first resistor; and
   a voltage sense circuit coupled across an output of the circuit, the voltage sense circuit including a transistor coupled to the LED; the transistor further coupled to a voltage reference, the LED further driven by the transistor in response to a voltage across the output of the circuit.

2. The circuit of claim 1 wherein the transistor is coupled to drive the LED in response to the voltage across the output of the circuit exceeding a sense voltage of the voltage sense circuit.

3. The circuit of claim 2 wherein the transistor comprises a bipolar transistor having a base coupled to the voltage reference, the bipolar transistor to drive the LED when the voltage across the output exceeds the sense voltage of the voltage sense circuit.

4. The circuit of claim 3 wherein the voltage reference is provided by a zener diode coupled to the output of the circuit.

5. The circuit of claim 4 wherein the sense voltage includes a sum of the voltage reference provided by the zener diode and a forward base emitter voltage of the bipolar transistor.

6. The circuit of claim 1 wherein the LED is included in an optocoupler.

7. The circuit of claim 6 wherein the optocoupler is coupled to provide feedback from an output of a power supply, the optocoupler coupled to provide the feedback to a power supply controller included in the power supply.

8. The circuit of claim 7 wherein the power supply is a switched mode power supply.

9. The circuit of claim 1 wherein the first diode comprises a PN junction diode.

10. A circuit, comprising:
    a voltage sense circuit coupled across an output, the voltage sense circuit including a voltage reference coupled to the output to drive a base of a bipolar transistor coupled to the output when a voltage across the output exceeds a sense voltage of the voltage sense circuit; and
    a compensation circuit including a first resistor coupled to the output and the bipolar transistor, the compensation circuit further including a second resistor, the second resistor coupled between the first resistor and the base of the bipolar transistor such that a sum of a voltage drop across the first resistor and a forward base emitter voltage of the bipolar transistor is to be applied across the second resistor, the sense voltage of the voltage sense circuit varied in response to a current through the second resistor.

11. The circuit of claim 10 further comprising a light emitting diode (LED) coupled to be driven by the bipolar transistor, the LED included in an optocoupler.

12. The circuit of claim 11 wherein the output is an output of a power supply, the optocoupler coupled to provide feedback from an output to a power supply controller included in the power supply.

13. The circuit of claim 23 wherein the power supply is a switched mode power supply.

14. The circuit of claim 10 wherein the voltage reference is provided by a zener diode coupled to the output of the circuit such that the current through the second resistor is passed through the zener diode, the sense voltage includes a sum of the voltage reference provided by the zener diode and the forward base emitter voltage of the bipolar transistor.

15. The circuit of claim 14 further comprising a third resistor coupled to zener diode such that the current through the second resistor is further passed through the third resistor, the sense voltage including a sum of the voltage reference provided by the zener diode, a voltage drop across the third resistor and the forward base emitter voltage of the bipolar transistor.

16. The circuit of claim 10 wherein the compensation circuit further includes a diode coupled to the second resistor, the second resistor and diode coupled between the first resistor and the base of the bipolar transistor such that a sum of the voltage drop across the first resistor and the forward base emitter voltage of the bipolar transistor is to be applied across the second resistor and the diode.

17. The circuit of claim 16 wherein the diode comprises a PN junction diode.

18. The circuit of claim 10 wherein the sense voltage is coupled to be increased in response to an increase in a load current supplied from the output.

19. A circuit, comprising:
    a voltage sense circuit coupled across an output, the voltage sense circuit including a first resistor, a zener diode coupled to the first resistor and a light emitting diode of an optocoupler coupled to be driven by the first resistor and the zener diode when a voltage across the output exceeds a sense voltage of the voltage sense circuit, the sense voltage of the voltage sense circuit includes a sum of a voltage drop across the zener diode, a forward voltage of the LED and a voltage drop across the first resistor;
    a current sense circuit coupled to the output, the current sense circuit coupled to provide a voltage representative of a load current supplied from the output; and
    a voltage compensation circuit coupled to the current sense circuit and to the voltage sense circuit to vary the voltage drop across the first resistor in response to the voltage representative of a load current supplied from the output.

20. The circuit of claim 19 wherein the voltage drop across the first resistor is increased in response to an increase in the load current supplied from the output.

21. The circuit of claim 19 wherein the output is an output of a power supply, the optocoupler is coupled to provide feedback from the output to a power supply controller included in the power supply.

22. The circuit of claim 21 wherein the power supply is a switched mode power supply.

23. The circuit of claim 19 wherein the current sense circuit includes a second resistor coupled to a diode, the second resistor and diode coupled to the output such that the load current is directed through the second resistor and the diode.

24. The circuit of claim 23 wherein the voltage compensation circuit includes a third resistor coupled to an emitter of a bipolar transistor, a series combination of the third resistor and a base emitter junction of the bipolar transistor coupled across the current sense circuit such that a collector current of the bipolar transistor is proportional to a voltage drop across the second resistor.

25. The circuit of claim 24 wherein a collector of the bipolar transistor is coupled to the first resistor such that the voltage drop across the first resistor is responsive to the voltage drop across the second resistor.

26. A circuit, comprising:
a current sense circuit coupled to an output of the circuit, the current sense circuit including,
a first diode;
a first resistor coupled to the first diode, the first resistor and first diode coupled to the output such that a load current supplied from the output is directed through the first diode and the first resistor;
a second resistor coupled to the first resistor and the first diode; and
a light emitting diode coupled to the first resistor and the second resistor and the diode such that the voltage drop across the first resistor and the first diode is coupled to drive the LED;
a voltage sense circuit coupled to the output and the current sense circuit, the voltage sense circuit including,
a zener diode coupled to the output;
a third resistor coupled in series with the zener diode;
a fourth resistor coupled to the zener diode and the output; and
a bipolar transistor coupled to the LED, the output and the third resistor, the bipolar transistor coupled to drive the LED when a voltage across the output exceeds a sense voltage, the sense voltage including a sum of a voltage drop across the zener diode and a forward base emitter voltage of the bipolar transistor; and
a voltage compensation circuit coupled to the output and the voltage sense circuit, the voltage compensation circuit including,
a fifth resistor coupled to an emitter of the bipolar transistor and to the output such that a current through the fifth resistor is substantially representative of the load current supplied from the output;
a sixth resistor coupled to the fifth resistor
a second diode coupled to the sixth resistor, the sixth resistor and the second diode coupled in series between a base of the bipolar transistor and the fifth resistor such that the sense voltage is varied in response to the current through the fifth resistor.

27. The circuit of claim 26 wherein the bipolar transistor includes one of a PNP transistor or an NPN transistor.

28. A circuit, comprising:
a first diode;
a first resistor coupled to the first diode, the first resistor and first diode coupled to an output of the circuit such that a a load current supplied from the output is directed through the first diode and the first resistor;
a second resistor coupled to the first diode and the first resistor;
a light emitting diode (LED) coupled to the first resistor and the second resistor and the diode such that the voltage drop across the first resistor and the first diode is coupled to drive the LED;
a third resistor coupled to the output;
a zener diode coupled to the third resistor and to the LED;
a bipolar transistor having a collector coupled to the third resistor and the zener diode and a base coupled to the output; and
a fourth resistor coupled between an emitter of the bipolar transistor and the first resistor.

29. A method, comprising:
sensing a voltage across an output of a circuit with a voltage sense circuit having a sense voltage that is the sum of a voltage reference and a base emitter voltage drop of a transistor;
regulating the voltage across the output of the circuit at the sense voltage in a closed loop;
compensating a voltage drop in a resistor that couples the output of the circuit to a load using a compensation circuit;
changing the sense voltage with the compensation circuit as a function of a load current supplied by the output of the circuit to compensate for the voltage drop across the resistor; and
canceling substantially the base emitter voltage drop of the transistor with a diode included in the compensation circuit.

30. The method of claim 29 further comprising:
sensing the load current with a current sense circuit having a current sense threshold;
regulating the load current at the current sense threshold in a closed loop when the load current reaches the current sense threshold.

* * * * *